United States Patent [19]

Shirasaki

[11] Patent Number: 5,281,804
[45] Date of Patent: Jan. 25, 1994

[54] MIRROR APPARATUS FOR INCREASING LIGHT ABSORPTION EFFICIENCY OF AN OPTICAL DETECTOR

[75] Inventor: Masataka Shirasaki, Belmont, Mass.

[73] Assignees: Fujitsu Ltd., Kawasaki, Japan; Mass. Institute of Tech., Cambridge, Mass.

[21] Appl. No.: 926,761

[22] Filed: Aug. 6, 1992

[51] Int. Cl.[5] .......................... H01J 40/14; H01J 3/14; H01L 27/14
[52] U.S. Cl. ................................ 250/214.1; 250/216; 257/436
[58] Field of Search ................. 250/216, 228, 214.1; 356/236; 257/436, 432

[56] References Cited

U.S. PATENT DOCUMENTS

| 2,984,747 | 5/1961 | Walker ........................ 250/83.3 |
| 3,327,583 | 6/1967 | Vanderschmidt et al. ........... 88/14 |
| 3,567,948 | 3/1971 | Oke et al. ...................... 250/216 |
| 3,815,977 | 6/1977 | Vasiliev et al. ................. 350/286 |
| 3,873,829 | 3/1975 | Evrard et al. ................... 250/216 |
| 4,012,144 | 3/1977 | Hedelman ....................... 356/73 |
| 4,027,160 | 5/1977 | Driffield et al. . |
| 4,782,382 | 11/1988 | Godfrey ......................... 257/436 |
| 4,853,542 | 8/1989 | Milosevic et al. ................ 250/228 |
| 4,854,659 | 8/1989 | Hamerslag et al. ............... 250/216 |

FOREIGN PATENT DOCUMENTS

| 207994 | 3/1984 | German Democratic Rep. . |
| 57-048276 | 3/1982 | Japan ............................ 257/436 |
| 0434872 | 8/1976 | U.S.S.R. ........................ 257/436 |

OTHER PUBLICATIONS

Oriel Catalogue vol. III, *Optics & Filters*, 1990, 3-2-3-3, 5-2-5-5, 10-2-10-5, 10-8-10-9.

Hirschfeld, T., *Total Internal Reflection Enhancement of Photo-dectector Performance*, Analytical Chemistry, vol. 42, No. 14 pp. 87A-92A, Dec. 1970.

Jackson, *Wide-angle And Efficient Optics For a Lateral Photo-electric Detector*, Optical Soc. America, 56 pp. Oct. 5, 1971.

Primary Examiner—Michael Messinger
Attorney, Agent, or Firm—Wolf, Greenfield & Sacks, P.C.

[57] ABSTRACT

An optical detector having a detection surface and a mirror sized and positioned relative to the surface so as to receive and return light which is reflected off of the detecting surface within the response time of the system.

14 Claims, 2 Drawing Sheets

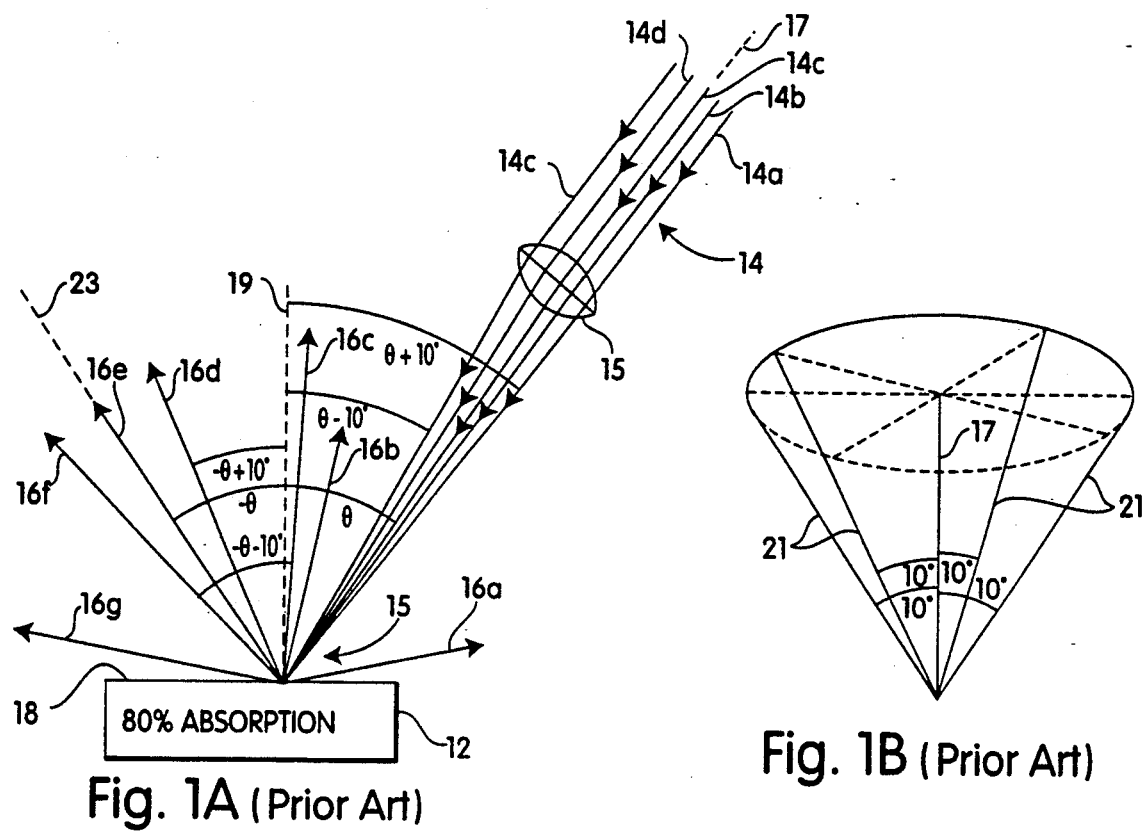
Fig. 1A (Prior Art)
Fig. 1B (Prior Art)
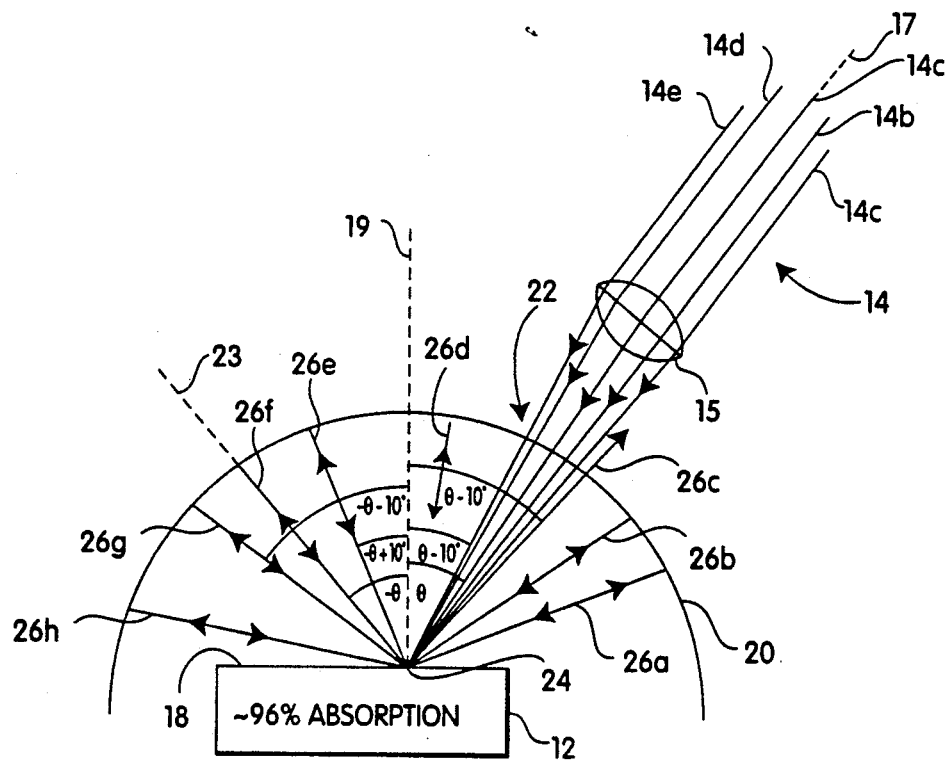
Fig. 2

MIRROR APPARATUS FOR INCREASING LIGHT ABSORPTION EFFICIENCY OF AN OPTICAL DETECTOR

FIELD OF THE INVENTION

The invention pertains to optical detectors. More particularly, the invention pertains to optical detectors having increased light absorption efficiency.

BACKGROUND OF THE INVENTION

Almost all systems which utilize light beams for communications, measurement, experiment or otherwise, include devices for detecting the light. Such devices are generally referred to as optical detectors which, in most communications or measurement applications, comprise semiconductor photodiodes.

A semiconductor photodiode comprises a semiconductor surface which, when exposed to light, causes an electrical current to flow on the surface. The output of a semiconductor photodiode type optical detector is typically coupled to processing electronics which amplify and condition the produced electrical signal. For example, circuitry may be provided 1) to sharpen the edges of light pulses by detecting when the signal strength passes a threshold level and cutting off the signal at that point or 2) to check and modify the timing of a series of pulses.

How well an optical detector performs its function of detecting light and producing electric current therefrom is sometimes termed quantum efficiency and depends on 1) its sensitivity to light striking its detection surface, 2) the intensity of the light which strikes the detection surface and 3) the reflectivity of the detector surface.

Sensitivity of a semiconductor photodiode depends on the operating conditions, the detector design, and how the particular semiconductor material used responds to light of different wavelengths. For instance, silicon photodiodes are particularly sensitive to light of 0.8 to 0.9 micrometer wavelength but are not usable for detecting light of 1.3 micrometers in wavelength. Other semiconductor photodiode materials such as germanium or indium gallium arsenide (InGaAs) are more sensitive to longer wavelengths.

Normally, significant light energy is wasted at the optical detector because a percentage of the light which strikes the photodiode is reflected off of the semiconductor surface instead of absorbed. It is not unusual for 20% or more of the light which strikes the surface of a semiconductor photodiode type optical detector to be reflected and wasted. The less light which is reflected and wasted, the higher the quantum efficiency of the photodiode.

U.S. Pat. No. 3,815,977 issued to Vasiliev discloses a photo detector incorporating a prism above the detecting surface for returning light which was reflected off of the detector surface back to the detector surface. Vasiliev teaches two different embodiments. In the first embodiment, incident light reflected off of the photo-detector surface strikes a face of the prism and is returned to a different point on the detector surface. Reflection off of the detector surface from that second point is again reflected off of a different face of the prism and returned to a third point and so on for subsequent reflections. In the second embodiment taught by Vasiliev et al., light is returned to the original point of incidence on subsequent reflections, however, the light is reflected off of two separate surfaces of the prism before being returned to the point of incidence. As in the first embodiment, light is returned to the detector surface a plurality of times, but with each return requiring reflections off of two separate surfaces of the prism rather than one. The photo-detector of Vasiliev recovers only light reflected along the primary axis of reflection. Light which is scattered (i.e., not reflected along the primary axis of reflection) is not recovered in the photo-detector of Vasiliev et al.

Accordingly, it is an object of the present invention to provide an improved optical detector arrangement.

It is a further object of the present invention to provide an optical detector with a significantly decreased reflection loss.

SUMMARY OF THE INVENTION

The invention comprises an optical detector which is surrounded by a mirror which receives light reflected off of the detector surface and returns it back to the detector surface. In its most preferable embodiment, the optical detector is surrounded by a hemi-spherical mirror having a hole through which the incoming light passes and strikes the detector. The detector is positioned in the exact center of the sphere such that the incident light which is reflected off the detector and strikes the mirror is reflected by the mirror back to the detector. The incident light beam should not be incident perpendicular to the primary surface of reflection of the detector since, in such a case, the axis of primary reflection would be directly back towards the source of the incident light beam, i.e., the position of the hole in the mirror.

In other embodiments, the mirror may be planar or arc shaped and may be positioned so as to capture and return light reflected along the axis of primary reflection while allowing light which is reflected significantly away from the axis of primary reflection to be lost.

The invention significantly decreases the reflection loss of an optical detector from, for example, about 20% to about 4% or, alternately stated, increases its light receiving efficiency from about 80% to approximately 95-96%.

In the Drawing

FIG. 1A is a two dimensional pictorial representation of a three dimensional prior art photo detector.

FIG. 1B is a perspective view of the incident light beam of FIG. 1A, which shows its three dimensional character.

FIG. 2 is a two dimensional pictorial representation of a three dimensional photo detector of a first embodiment of the present invention.

DETAILED DESCRIPTION OF THE INVENTION

Figure 3:
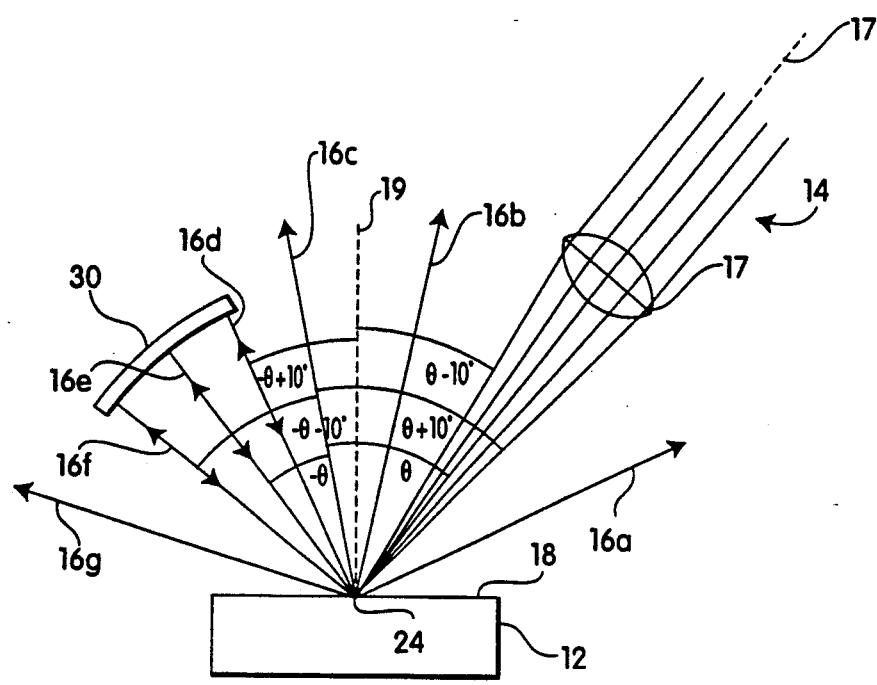
FIG. 3 is a two dimensional pictorial representation of a three dimensional second embodiment of the optical detector of the present invention.

FIG. 1A is a two dimensional pictorial representation of a semiconductor photodiode 12 of the prior art. A light beam 14 which is to be detected by the photodiode 12 is generally illustrated by exemplary light rays 14a-14e. The light beam 14 is focused onto a spot 15 on surface 18 of photodiode 12 by a focusing lens 15. As a typical example, 80% of the incident light beam 14 is absorbed by the semiconductor surface 18. 20% is reflected off of the surface 18 as illustrated by reflected light rays 16a–16g.

In FIG. 1A, beam 14 is incident to the detector surface 18 primarily along an axis 17 in the plane of the page at an angle $\theta$ from the line 19 which is perpendicular to the surface 18 of the detector. As shown in FIG. 1A, light ray 14c is incident exactly along axis 17. However, since light travels in three dimensional space as opposed to two dimensional space, and since the light is focused by focusing lens 15, all of beam 14 is not incident exactly parallel to axis 17 but is incident within a small range of axis 17 (for example, within a 10° range, as illustrated by beams 14a, 14b, 14d and 14e in FIG. 1A).

FIG. 1A is a two dimensional representation of what is actually a three dimensional detector. FIG. 1B illustrates the three dimensional nature of the incident light beam 14. Beam 14 is incident within a 10° range in all directions of axis 17, and is not only in the plane of the page. In other words, the individual light rays of incident beam 14 are within a three dimensional cone having an axis of revolution along axis 17 and a generator 21 tilted 10° from the axis of revolution, as shown in FIG. 1B. FIG. 1B shows generator 21 at various positions of revolution around axis 17. Beam 14c as seen in FIG. 1A is incident along axis 17, whereas beams 14a and 14e are on the cone surface defined by generator 21. Beams 14b and 14d in FIG. 1A are between the axis 17 and the cone surface within the volume of the cone.

If beam 14 is incident to the detector primarily within a 10° range of axis 17, the majority of the reflected light will be reflected within a 10° range of axis 23. Axis 23 is in the plane of the page at an angle $\theta$ from line 19. Rays 16d, 16e and 16f are within the 10° primary range of reflection. The primary range of reflection is also three dimensional. Since surface 18 cannot be perfectly smooth, smaller amounts of light are reflected off in all other directions (i.e., scattered) as illustrated in two dimensions by exemplary reflected rays 16a–16c and 16g. All of the light reflected off of surface 18 is lost.

A two dimensional representation of a preferred embodiment of the present invention is shown in FIG. 2. In this embodiment surface 18 of semiconductor photodiode 12 is placed adjacent the center of a sphere defined by hemi-spherical mirror 20. The mirror may be constructed of a metal coating on the inside surface of a metal or plastic substrate. Incident light beam 14 is incident to surface 18 along the same axis as described above with respect to FIG. 1A. The beam 14 is focused on surface 18 at the exact center 24 of the sphere. A gap 22 is provided in the hemi spherical mirror 20 in a position such that the incident light beam 14 can pass through the hole. The hole 22 should be as small as possible without blocking any of the incident light beam 14. As before, approximately 80% of the light is initially absorbed while approximately 20% is reflected off of surface 18 of photodiode 12. Also as before, the majority of reflected light travels within a 10° range of axis 23, as illustrated by exemplary reflected rays 26d–26f. However, also as before, some light is reflected in all other directions, as illustrated by exemplary rays 26a–26d and 26h.

Almost all of the reflected rays 26a–26h strike the hemi spherical mirror 20 and return to the center of the sphere 24 along the same path in the opposite direction, as illustrated by the arrows on rays 26a–26b, and 26d–26h. Only rays reflected back through the hole 22, such as ray 26c, are not reflected back by mirror 20. A hemi spherical mirror, by definition, reflects light which travels from or through the center of the sphere 24 in a straight line back to the center of the sphere 24. Accordingly, almost all of the light which is reflected off of point 24 of the surface 18, except for the light which passes back through the hole 22, is returned to point 24 on surface 18 of the photodiode 12.

If we assume 20% reflectivity, 80% of the reflected light which is returned to the photodiode 12 will be absorbed and 20% will be reflected again. Accordingly, assuming the mirror is 100% reflective (an ideal mirror), then all of the 20% of incident light beam 14 which was initially reflected off of surface 18 of the photodiode 12 is returned to the photodiode 12. 80% of that light is absorbed. Since 80% of 20% is 16%, light absorption is increased from 80% to 80%+16%=96% on the first reflection. The remaining 4% is reflected again. The 4% of light which is reflected off of surface 18 of photodiode 12 the second time strikes the mirror 20 again and is redirected back to the photodiode at point 24. This occurs ad infinitum.

Mirror 20 in actuality is not likely to be 100% reflective. However, mirrors with extremely high reflectivity are available such that the energy lost at the mirror is small.

Although the reflections off of surface 18 and mirror 20 continue to occur, any light reflected back to the photodiode after the sampling period of the detector expires is irrelevant. Therefore, the sampling period of the detector should be set to allow reception of the desired number of reflections before the sampling period closes. In practice, the amount of light reflected and absorbed by the photodiode on reflections subsequent to the first reflection typically are quite small (on the order of 3% or less). It is foreseen that, in most practical applications, recovery of the second and subsequent reflections off of the photodiode will not be of concern, particularly in high speed systems.

Assuming it is desired to capture only the first reflection, the distance of the reflective mirror 20 from the photodiode should be short enough such that light can be reflected off of the photodiode 12, reach the mirror 20 and be returned to the photodiode 12 within the sampling period of the photo detector. Generally speaking, the distance, d, between the detector and the mirror surface should be substantially less than c/bandwidth of the system, where c is the speed of light. Stated in other terms, the distance, d, should be substantially less than (c)·(system response time). For instance, if the system speed is 20 to 30 gigahertz, the distance between the detector and the mirror surface should be no greater than 500 to 1000 microns.

The incident axis of the light beam 14 should not be perpendicular to the primary surface of reflection of the surface 18, i.e., it should not be along line 19 in FIG. 2. If it was, the axis of primary reflection would be right back into the incident beam. This is undesirable since there is a hole in the mirror at this point and, consequently, the majority of the reflected light would never strike the mirror 20 but would pass through hole 22.

In the preferred embodiment, the axis of primary incidence of beam 14 is along the Brewster's angle of the detector and the beam is linearly polarized with its electrical vector in the plane of incidence (i.e., it is parallel polarized). The Brewster's angle of the detector is given by Brewster's law which states that the index of refraction of a material (i.e., the semiconductor of surface 18) is equal to the tangent of the polarizing angle for the material. In effect, the Brewster's angle for detector 12 would be the angle at which the reflectivity for light whose electrical vector is in the plane defined by the incident light beam and the axis normal to the surface of the detector at the point of incidence is zero. Accordingly, if the incident light beam 14 is incident at the Brewster's angle, the amount of reflected light energy is significantly reduced.

FIG. 3 illustrates a second embodiment of the present invention. In this embodiment, an arc portion of a spherical mirror 30 is centered at the axis of primary reflection and is large enough to capture light reflected off surface 18 within three dimensional angular range, e.g., 10°, of the axis of primary reflection. Thus, the majority of the reflected light rays are returned as illustrated by double direction rays 16d-16f, while rays reflected significantly away from the primary range of reflection, e.g., more than 10° from the axis of primary reflection, are lost as illustrated by rays 16a-16c and 16g.

Figure 4:
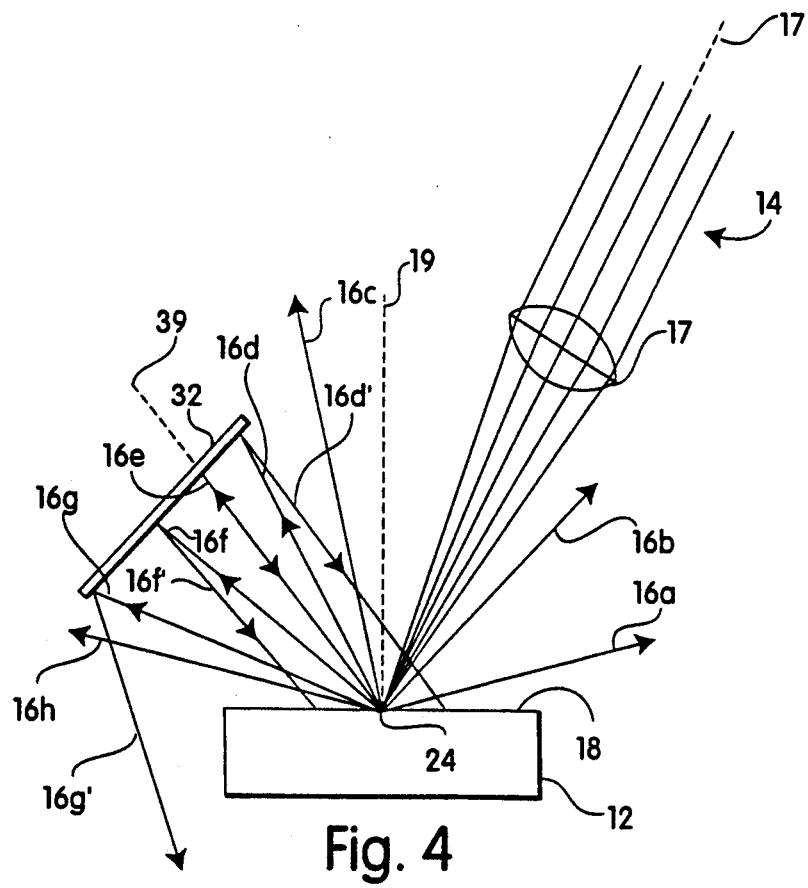
FIG. 4 is a two dimensional pictorial representation of a three dimensional third embodiment of the optical detector of the present invention.

FIG. 4 illustrates a less expensive embodiment of the invention utilizing a planar mirror 32 rather than the more expensive hemi-spherical or arc shaped mirrors. The planar mirror is oriented such that it is centered at and normal to the axis of primary reflection 39. The reflecting surface of mirror 32 should be circular or square and have an area large enough to capture light rays reflected within a reasonable range of the axis of primary reflection, e.g., at least 10°. With a planar mirror, as opposed to spherical mirror with the detector positioned at the center of the sphere, only light reflected exactly along the axis of primary reflection 39, as illustrated by ray 16e, is reflected directly back to point 24 along the path of the incident ray. Light rays which are not reflected exactly along the axis of primary reflection are not reflected back exactly along the same path from which they were incident to mirror 32, but are reflected back along different paths to different points on surface 18 such that they still strike the semiconductor surface 18 and produce electricity. This is illustrated by rays 16d and 16f reflected off of surface 18 to mirror 32 and the corresponding rays 16d' and 16f', respectively, returning to surface 18 from mirror 32. Other beams such as 16g which are further away from the axis of primary reflection 39 strike the mirror 32 but are not reflected back to surface 18 as illustrated by return ray 16g'. Further, as with the embodiment of FIG. 3, some rays, such as illustrated by rays 16a-16c and 16h do not strike the mirror at all and their energy is lost.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An optical detecting apparatus having a predetermined system response time for detecting an incident light beam, comprising:

a semiconductor photodiode optical detector having a surface on which said light beam is incident at a predetermined point, said detector absorbing a percentage of the light beam incident on the surface and reflecting a percentage of the light beam off the surface, a mirror positioned to receive at least a majority of the light reflected off of said detector surface and return said reflected light to said predetermined point in a single reflection, and said mirror being at a distance from said detector surface which is less than one half the product of the response time of the apparatus and the speed of light.

2. An optical detecting apparatus as set forth in claim 1 wherein said mirror is an at least partially spherical mirror and wherein said detector surface is positioned so that said incident light beam strikes said detector surface at the center of the sphere defined by said at least partially spherical mirror.

3. An optical detecting apparatus as set forth in claim 2 wherein said mirror is a hemi-sphere having an opening through which said incident light beam passes to strike said photodiode.

4. An optical detecting apparatus as set forth in claim 3 wherein said incident light beam is incident to said detector surface along an axis which is not normal to said detector surface.

5. A optical detecting apparatus as set forth in claim 4 wherein said incident light beam is incident to said detector surface at the Brewster's angle of said detector surface.

6. An optical detecting apparatus as set forth in claim 5 wherein said incident light beam is linearly polarized with its electrical vector in a plane defined by said incident light beam and an axis normal to said surface and passing through said predetermined point.

7. An optical detecting apparatus as set forth in claim 2 wherein said mirror has a metal coating on an inside surface of a substrate.

8. An optical detecting apparatus as set forth in claim 7 wherein said substrate is metal.

9. An optical detecting apparatus as set forth in claim 7 wherein said substrate is plastic.

10. An optical detecting apparatus as set forth in claim 1 wherein said detector surface has an axis of primary reflection dependent upon the axis of incidence of said incident light beam and wherein said mirror is positioned to receive from and return to said predetermined point at least the light reflected off of said means for detecting substantially along said axis of primary reflection in a single reflection.

11. An optical detecting apparatus as set forth in claim 10 wherein said mirror is concave.

12. An optical detecting apparatus as set forth in claim 11 wherein said mirror is formed as a portion of a sphere and said detecting surface is positioned at the center of the sphere defined by said mirror.

13. An optical detecting apparatus as set forth in claim 10 wherein said mirror is planar.

14. An optical detecting apparatus as set forth in claim 12 wherein said incident light beam is incident to said detecting surface at the Brewster's angle of said detecting surface, and said incident light beam in linearly polarized with its electrical vector in the plane of incidence of said incident light beam.

* * * * *